(12) United States Patent
Ranganathan

(10) Patent No.: US 7,098,735 B2
(45) Date of Patent: Aug. 29, 2006

(54) REFERENCE BUFFER WITH DYNAMIC CURRENT CONTROL

(75) Inventor: Sumant Ranganathan, Sunnyvale, CA (US)

(73) Assignee: Broadcom Corporation, Irvine, CA (US)

(*) Notice: Subject to any disclaimer, the term of this patent is extended or adjusted under 35 U.S.C. 154(b) by 159 days.

(21) Appl. No.: 10/835,461

(22) Filed: Apr. 30, 2004

(65) Prior Publication Data

US 2005/0062521 A1  Mar. 24, 2005

Related U.S. Application Data

(60) Provisional application No. 60/499,459, filed on Sep. 3, 2003.

(51) Int. Cl.
*H03F 3/45* (2006.01)

(52) U.S. Cl. .................................. 330/252; 330/260

(58) Field of Classification Search ............... 341/155; 327/541, 543, 530, 538, 540, 545; 330/252, 330/260
See application file for complete search history.

(56) References Cited

U.S. PATENT DOCUMENTS 5,854,574 A * 12/1998 Singer et al. .............. 330/293
5,945,844 A * 8/1999 Vo ............................... 326/71
6,054,886 A * 4/2000 Opris et al. ................ 327/304
6,285,231 B1 * 9/2001 Opris et al. ................ 327/304
6,417,725 B1 * 7/2002 Aram et al. ................ 327/541
2002/0080056 A1 * 6/2002 Karanicolas ............... 341/155

* cited by examiner

*Primary Examiner*—Linh Van Nguyen
(74) *Attorney, Agent, or Firm*—Sterne, Kessler, Goldstein & Fox P.L.L.C.

(57) ABSTRACT

A method can allow a system to selectively control increasing of a bias source in a reference buffer or decreasing impedance looking into a output of the reference buffer for a temporary or selective time period, which can result in an increased overall efficiency of the system. The method can include at least the following steps. A first input signal is received at an input of a reference buffer. A second input signal is received from a load at an output of the reference buffer. A value of a bias source coupled to the output of the reference buffer is modulated, such that a spike of a signal at the output of the reference buffer caused by the second input signal is maintained below a threshold value. Alternatively, an impedance looking into the output of the reference buffer is modulated, such that a spike of a signal at the output of the reference buffer caused by the second input signal is maintained below a threshold value.

18 Claims, 4 Drawing Sheets

REFERENCE BUFFER WITH DYNAMIC CURRENT CONTROL

CROSS REFERENCE TO RELATED APPLICATIONS

This application claims benefit under 35 U.S.C. §119(e) to U.S. Prov. App. No. 60/499,459, filed Sep. 3, 2003, entitled "Reference Buffer with Dynamic Current Control," which is incorporated by reference herein in its entirety.

BACKGROUND OF THE INVENTION

Background Art

A reference buffer is an amplifier designed to maintain a desired constant reference voltage (e.g., output signal or output voltage) to be used by subsequent circuits, such as in an analog to digital converter (ADC), a digital to analog converter (DAC), or the like. Typically, the reference buffer is coupled to the subsequent circuits via a switched capacitor (Cs) load, or the like.

A switched capacitor load charged to a different voltage (in this case 0V) is received at an output node of the reference buffer at the start of every phase (i.e., half clock cycle) of operation of the load. This received charge instantaneously pulls the output node away from its original voltage (in this case to ground). This can cause a spike in a value of a signal that is output from the node. The signal has to return to a desired constant voltage by the end of that phase for the reference buffer to maintain the correct functionality. Thus, the reference buffer needs to return the signal to the desired constant value before each subsequent phase irrespective of a varying load causing the spike. Recovery and a time for recovery of the signal to the desired constant value after the spike is very critical for the proper operation of the reference buffer. In one example, if a system is running at 100 MHz, each phase can be about 5 ns. In this case, a required recovery time is relatively short for the reference buffer to bring the output signal value back to the desired constant voltage after the spike.

Typically, to ensure the output signal settles at the desired constant voltage after the spike, the reference buffer uses a large DC bias current in its output stage. This bias current reduces the output impedance of the reference buffer, which results in a smaller spike and hence better reference buffer settling time after the spike. Unfortunately, the value of the bias current is usually large to maintain the normal operations of the reference buffer. This results in an increase in power dissipation for the reference buffer, which lowers its efficiency.

Therefore, what is needed is a more efficient system and method to ensure a signal output from an output node of a reference buffer quickly settles to a desired constant voltage in a desired time frame after a spike of the signal is caused by an input from a varying load being received at the output node.

BRIEF SUMMARY OF THE INVENTION

An embodiment of the present invention provides a method including at least the following steps. Receiving a first input signal at an input of a reference buffer. Receiving a second input signal from a load at an output of the reference buffer. Modulating a value of a bias source coupled to the output of the reference buffer, such that a spike of a signal at the output of the reference buffer caused by the second input signal is maintained below a threshold value.

Another embodiment of the present invention provides a method including at least the following steps. Receiving a first input signal at an input of a reference buffer. Receiving a second input signal from a load at an output of the reference buffer. Modulating an output impedance (e.g., an impedance looking into the output of the reference buffer), such that a spike of a signal at the output of the reference buffer caused by the second input signal is maintained below a threshold value.

A further embodiment of the present invention provides a system including a reference buffer having an input and an output, a bias source coupled to the output, a control device coupled to the bias source, and a load coupled to the output. Receiving a charge from the load at the output causes a spike of a signal at the output and the control device modulates the bias source so that the spike is maintained below a threshold value.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
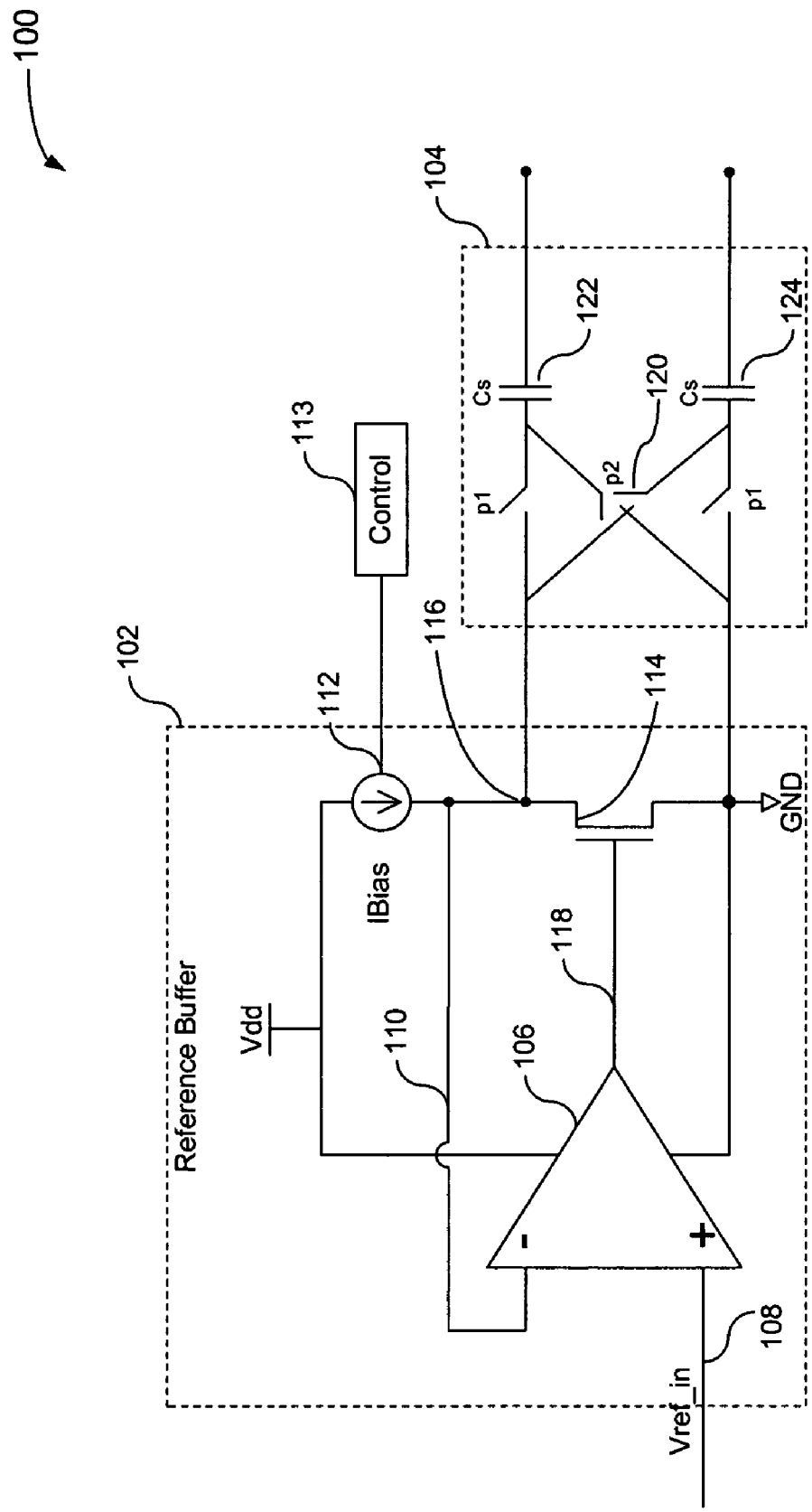
FIG. 1 shows a schematic diagram of a reference buffer driving a switched capacitor load according to an embodiment of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 shows a schematic diagram of a system 100 according to an embodiment of the present invention. System 100 includes a reference buffer 102 and a load 104 (e.g., a temporally varying load, a switched capacitor load, or the like).

Reference buffer 102 includes an amplifier 106 (e.g., an operational amplifier) coupled between a power source (e.g., Vdd) and ground (e.g., GND). Amplifier 106 receives an input signal 108 (e.g., a first input signal or Vref_in) at its positive input terminal and a feedback signal 110 from a node 116 (e.g., an output of amplifier 106). A bias current from bias source 112 (e.g., a bias current source) for output transistor 114 is also connected to node 116. The magnitude of bias current source 112 required can depend on a type of load 104.

Bias source 112 can be coupled to a control device 113 (e.g., a register) that is used to control bias source 112, so as to modulate or vary a value of bias source 112, as will be described in more detail below. Other now known and later developed ways of modulating bias source 112, as would be apparent to one of ordinary skill in the art upon reading this description, are contemplated within the scope of the present invention. Bias source 112 is coupled between Vdd and node 116. A transistor 114 (e.g., a metal-oxide-silicon field effect (MOSFET) transistor, a bipolar transistor, or the like) is coupled between node 116 and GND. Transistor 114 receives a signal 118 from an output terminal of amplifier 106 at its gate.

In one embodiment load 104 can be a switched capacitor load. Switched capacitor load 104 can have a switching system 120 driven by switching signal 230 (FIG. 2) (e.g., p1) during a first phase and switching signal 240 (FIG. 2) (e.g., p2) during a second phase. The switched capacitor load 104 can also include first and second capacitors Cs 122 and 124, respectively, coupled to switching system 120.

Figure 2:
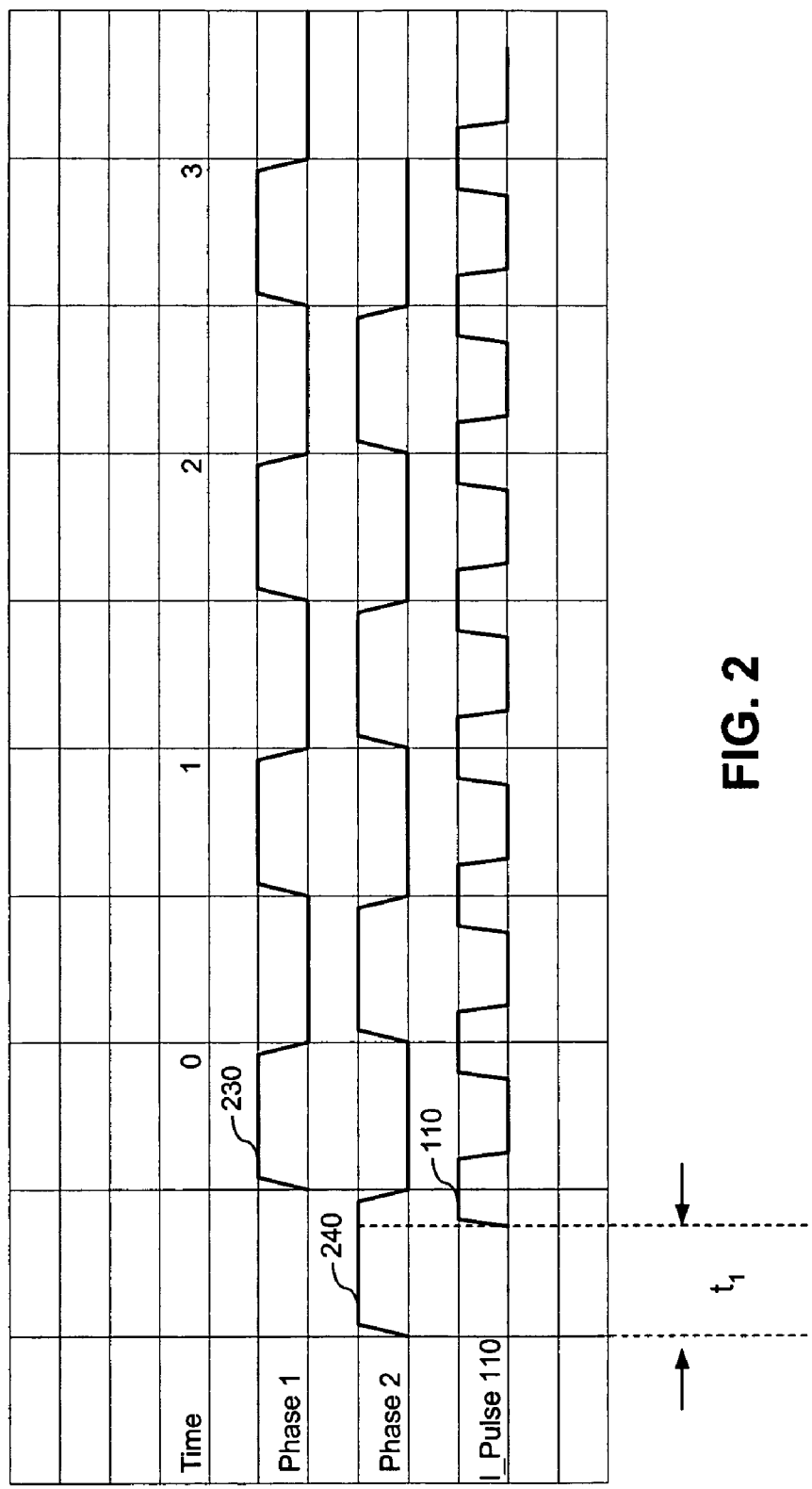
FIG. 2 is a timing diagram of signals in a reference buffer according to embodiments of the present invention.

FIG. 2 is a timing diagram of switch control signals 230 (e.g., p1) and 240 (e.g., p2) and bias source 112 according to embodiments of the present invention. Switch control signal 230 is used during a one (e.g., a first) phase of operation of load 104. Switch control signal 240 is used during another (e.g., a second) phase of operation of load 104. This embodiment is premised on load 104 having two phases of operation. It is to be appreciated loads can have more or less phases of operation, and all are contemplated within the scope of the present invention.

As discussed above, a value of a voltage at node 116 can spike at the beginning of each phase because of receiving a charge (e.g., a second input voltage) from load 104 at node 116 during the beginning of each phase. Reference buffer 102 needs to bring the value of the voltage at node 116 back to a desired constant voltage in a specified time period (e.g., within time period $t_1$ in FIG. 2, the time before a start of Phase 2 and just before $I_{pulse}$ going HIGH) after the spike. The desired constant voltage can be substantially equal to an initial voltage set using input signal 108. According the this embodiment, in order for reference buffer 102 to accomplish this, control device 113 causes bias source 112 to modulate or vary, e.g., temporarily increase from its nominal value, just before signals 230 or 240 go down (depending on the phase of operation of load 104). The reference buffer 102 should settle from both the spike and the modulation of bias source 112 before receiving subsequent charge (e.g., the subsequent second input signal) generated during subsequent phases of operation of load 104.

Modulating bias source 112 (e.g., temporarily increasing an output value) reduces the impedance looking into node 116 (e.g., the output impedance of reference buffer 102 as perceived by load 104) just before charge (e.g., the second input signal) from load 104 is received for each phase. This is because voltage=current×impedance, so if current goes up and voltage remains the same then impedance must go down. Reducing the impedance looking into node 116 allows for a reduction in a magnitude of the spike, which allows reference buffer 102 to have a smaller error to correct in a same time period (e.g., time period $t_1$). Reducing a magnitude of the error needing correction allows for faster settling of node 116 to the desired constant voltage. Thus, the modulation (e.g., temporary increase) of a value of bias source 112 in the present invention reduces a magnitude of the spike at node 116, which reduces a recovery time period from the spike.

Conventional systems required a continuous large bias source to compensate for the spike. Using a continuous large bias source results in a large and unnecessary power consumption. In contrast, using modulation of bias source 112 substantially reduces an overall power consumption of system 100, which increases the efficiency of system 100 compared to the conventional systems.

Method of Settling Reference Buffer During Transitional Period

Figure 3:
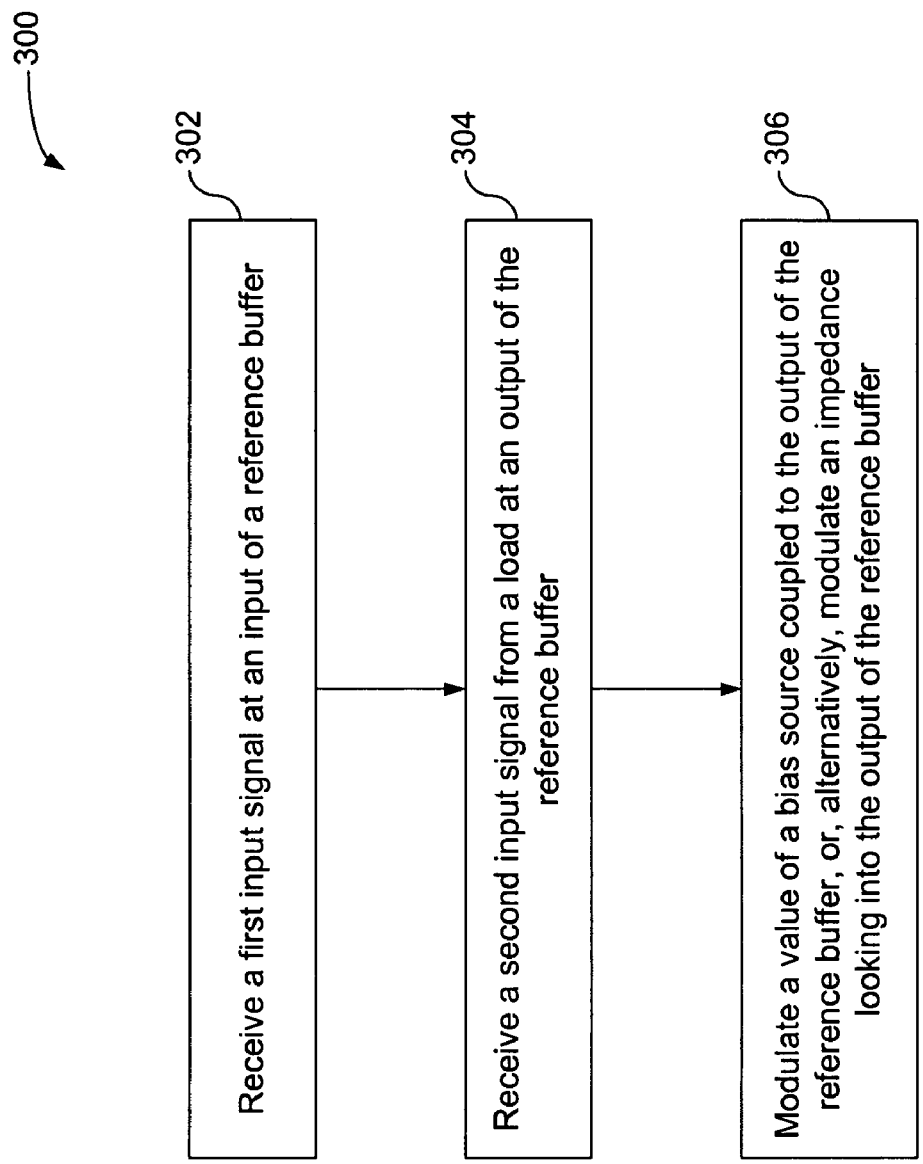
FIG. 3 is a flowchart depicting a method according to an embodiment of the present invention.

FIG. 3 is a flowchart depicting a method 300 according to an embodiment of the present invention. This method can be performed by system 100, or other functionally similar systems. At step 302, a first input signal is received at an input of a reference buffer. At step 304, a second input signal (e.g., a charge from a load) is received at an output of the reference buffer. At step 306, a value of a bias source coupled to the output of the reference buffer is modulated, such that a spike to a signal at the output of the reference buffer caused by the second input signal is maintained below a threshold value. In an alternative embodiment, at step 306, an impedance looking into the output of the reference buffer is modulated, such that a spike to a signal at the output of the reference buffer caused by the second input signal is maintained below a threshold value. The threshold value varies depending on a time for recovery needed for the signal at the output of the reference buffer.

Method 300 can allow system 100 to control increasing of a value of a bias source (e.g., decreasing of impedance) at node 116 for a temporary time period resulting in an increased overall efficiency of system 100 compared to conventional systems that use a high value for a bias source throughout an entire operation of a reference buffer, rather than during selective time periods in the present invention.

Differential Reference Buffer

Figure 4:
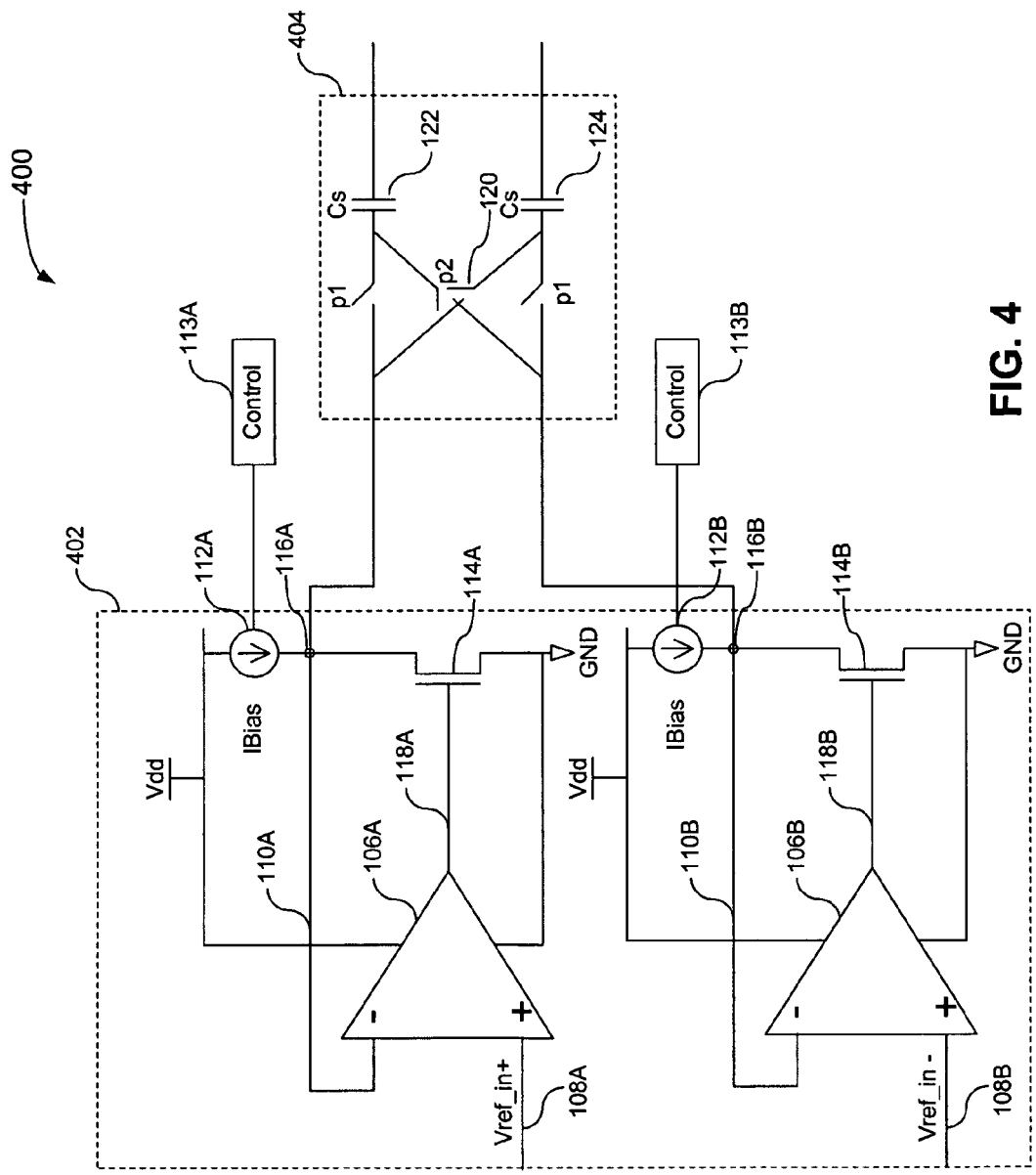
FIG. 4 shows a schematic diagram of a differential reference buffer driving a switched capacitor load according to an embodiment of the present invention.

FIG. 4 shows a schematic diagram of a system 400 according to an embodiment of the present invention. System 400 includes a reference buffer 402 and a load 404. Most of system 400 is similar to system 100, except reference buffer 402 has a differential circuit configuration therein.

Reference buffer 102 includes amplifiers 106A and 106B (e.g., two operational amplifiers) coupled between a power source (e.g., Vdd) and GND. Amplifiers 106A and 106B receive differential input signals 108A and 108B (e.g., Vref_in+/−), respectively, at their positive input terminals and feedback signals 110A and 110B at their inverting terminals. Bias sources 112A and 112B can be coupled to respective control devices 113A and 113B (e.g., registers) that are used to control respective bias sources 112A and 112B so as to perform the modulation or varying of a value of bias sources 112A and 112B, as was described above. Bias sources 112A and 112B are coupled between Vdd and respective nodes 116A and 116B. Transistors 114A and 114B (e.g., MOSFET transistors, bipolar transistors, etc.) are coupled between respective nodes 116A and 116B and GND, and each receives a signal 118A and 118B at their gates from an output terminal of a respective amplifier 106A and 106B.

In this manner, differential reference buffer 402 controls increasing of a value of bias sources 112A and 112B (e.g., decreasing of impedance looking into nodes 116A and 116B) for a temporary time period resulting in an increased overall efficiency of system 100 compared to conventional systems that use a high bias current throughout an entire operation of a reference buffer, rather than during selective time periods in the present invention.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method comprising:
   (a) receiving a first input signal at an input of a reference buffer;
   (b) receiving a second input signal from a load at an output of the reference buffer; and
   (c) modulating a value of a bias source coupled to the output of the reference buffer, such that a spike of a value at the output of the reference buffer caused by step (b) is maintained below a threshold value;
   wherein the second input signal varies during first and second phases of operation of the load; and the modulating step begin during one of the first and second phases and ends during another one of the first and second phases.

2. The method of claim 1, wherein the load comprises a temporally varying load.

3. The method of claim 1, wherein the load comprises a switched capacitor load.

4. The method of claim 1, wherein step (c) comprises temporarily increasing the value of the bias source.

5. The method of claim 1, wherein step (a) comprises using one of a constant single-ended input signal and a constant differential input signal as the first input signal.

6. The method of claim 1, further comprising positioning the bias source within the reference buffer.

7. A method comprising:
   (a) receiving a first input signal at an input of a reference buffer;
   (b) receiving a second input signal from a load at an output of the reference buffer; and
   (c) modulating an impedance looking into the output of the reference buffer, such that a spike of a value at the output of the reference buffer caused by step (b) is maintained below a threshold value;
   wherein the second input signal varies during first and second phases of operation of the load; and the modulating step begin during one of the first and second phases and ends during another one of the first and second phases.

8. The method of claim 7, wherein the load comprises a temporally varying load.

9. The method of claim 7, wherein the load comprises a switched capacitor load.

10. The method of claim 7, wherein step (c) comprises modulating a value of a bias source coupled to the output.

11. The method of claim 7, wherein step (c) comprises temporarily decreasing a value of the impedance.

12. The method of claim 7, wherein step (c) comprises temporarily increasing a value of a bias source coupled to the output.

13. The method of claim 7, wherein the load comprises a temporally varying load or a switched capacitor load.

14. The method of claim 7, wherein step (a) comprises using one of a constant single-ended input signal and a constant differential input signal.

15. A system comprising:
   a reference buffer having an input and an output;
   a bias source coupled to the output;
   a control device coupled to the bias source; and
   a load coupled to the output,
   wherein receiving charge from the load at the output causes a spike at the output and wherein the control device modulates the bias source so that the spike is maintained below a threshold value;
   wherein the receiving charge varies during first and second phases of operation of the load; and the modulating begin during one of the first and second phases and ends during another one of the first and second phases.

16. The system of claim 15, wherein the bias source is a current source.

17. The system of claim 15, wherein the control device is a register.

18. The system of claim 15, wherein the bias source is positioned within the reference buffer.

* * * * *